(12) United States Patent
Nagakubo

(10) Patent No.: US 11,148,179 B2
(45) Date of Patent: Oct. 19, 2021

(54) METHOD FOR CLEANING SUBSTRATE TRANSFER MECHANISM AND SUBSTRATE PROCESSING SYSTEM

(71) Applicant: Tokyo Electron Limited, Tokyo (JP)

(72) Inventor: Keiichi Nagakubo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 26 days.

(21) Appl. No.: 16/734,807

(22) Filed: Jan. 6, 2020

(65) Prior Publication Data

US 2020/0139413 A1    May 7, 2020

Related U.S. Application Data

(62) Division of application No. 15/457,884, filed on Mar. 13, 2017, now Pat. No. 10,569,310.

(30) Foreign Application Priority Data

Mar. 17, 2016   (JP) .............................. JP2016-054260

(51) Int. Cl.
*B08B 7/00*     (2006.01)
*H01L 21/67*    (2006.01)
*H01L 21/677*   (2006.01)

(52) U.S. Cl.
CPC ........ *B08B 7/0071* (2013.01); *H01L 21/6719* (2013.01); *H01L 21/67109* (2013.01); *H01L 21/67173* (2013.01); *H01L 21/67207* (2013.01); *H01L 21/67248* (2013.01); *H01L 21/67742* (2013.01); *H01L 21/67748* (2013.01)

(58) Field of Classification Search
None
See application file for complete search history.

(56) References Cited

U.S. PATENT DOCUMENTS

2005/0126586 A1   6/2005   Ha et al.
2010/0162956 A1   7/2010   Murakami et al.

FOREIGN PATENT DOCUMENTS

| JP | H11-354503 A | 12/1999 |
|---|---|---|
| JP | 2013-128005 A | 6/2013 |
| KR | 10-2008-0048410 A | 6/2008 |
| KR | 10-2011-0028250 A | 3/2011 |
| KR | 10-2013-0014406 A | 2/2013 |

OTHER PUBLICATIONS

United States Office Action, U.S. Appl. No. 15/457,884, dated May 13, 2019, eight pages.
United States Office Action, U.S. Appl. No. 15/457,884, dated Jan. 3, 2019, ten pages.

*Primary Examiner* — Eric W Golightly
(74) *Attorney, Agent, or Firm* — Fenwick & West LLP

(57) ABSTRACT

A substrate processing system comprising: a heat treatment chamber configured to sublimate by-products by heat; and a substrate carrier configured to load a substrate into the heat treatment chamber, the substrate carrier including a holder for holding the substrate, and a controller configured to control operations of the heat treatment chamber, the substrate carrier, and the holder, wherein the controller is programmed to control the sublimation to, (a) maintain a temperature of the holding unit at a level equal to or higher than a predetermined temperature, while (b) inhibiting thermal damage to the substrate transfer mechanism excluding the holding unit.

14 Claims, 8 Drawing Sheets

METHOD FOR CLEANING SUBSTRATE TRANSFER MECHANISM AND SUBSTRATE PROCESSING SYSTEM

CROSS-REFERENCE TO RELATED APPLICATION

This application is a divisional application of U.S. patent application Ser. No. 15/457,884 filed on Mar. 13, 2017, and issued as U.S. Pat. No. 10,569,310 on Feb. 25, 2020, which claims priority to Japanese Patent Application No. 2016-054260 filed on Mar. 17, 2016, the entire contents of which are incorporated herein by reference.

FIELD OF THE INVENTION

The disclosure relates to a method for cleaning a substrate transfer mechanism by removing adhered reaction by-products and a substrate processing system.

BACKGROUND OF THE INVENTION

As for a process for chemically etching and removing an oxide film formed on a semiconductor wafer (hereinafter, simply referred to as "wafer") as a substrate, there are known, e.g., a COR (Chemical Oxide Removal) process and a PHT (Post Heat Treatment) process. In the COR process, an oxide film formed on a surface of a wafer is made to react with hydrogen fluoride gas and ammonia gas, and ammonium hexafluorosilicate (AFS) is generated as a reaction by-product from the oxide film. In the PHT process, by heating the wafer, the generated AFS is removed by sublimation. In other words, the oxide film is removed by the COR process and the PHT process.

The COR process and the PHT process are performed in different process modules in consideration of improvement of a throughput. Therefore, a substrate processing system for removing an oxide film includes a transfer unit, e.g., a transfer arm, for transferring a wafer among the process modules. The transfer arm has a pick for mounting thereon the wafer. When the wafer is loaded into and unloaded from the process module, the pick of the transfer arm and a vicinity thereof move into the process module. Since sublimated AFS floats in a process module where the COR process is performed (hereinafter, referred to as "COR processing module") or in a process module where the PHT process is performed (hereinafter, referred to as "PHT processing module"), when the pick of a low temperature (or a room temperature) moves into the corresponding process module, the sublimated AFS is solidified and adhered on the surface of the pick. The AFS adhered on the pick may be peeled off during movement of the transfer arm between the process modules and adhered as particles on the wafer. Accordingly, semiconductor devices manufactured from the corresponding wafer may have defects.

Therefore, conventionally, an operator opens a lid of the transfer module where the transfer arm is provided at a proper timing and performs wet cleaning on the transfer arm. In that case, the inside of the transfer module is exposed to the atmosphere. Since, however, the inside of the transfer module needs to be maintained in a vacuum state, time is required to restore the substrate processing system by decompression after the wet cleaning.

Therefore, there has been recently proposed a technique that prevents sublimated AFS from being solidified on the surface of the pick or the like even when the pick of the transfer arm and the vicinity thereof move into the COR processing module or the PHT processing module by providing a heating room in addition to the process module and heating the pick of the transfer arm and the vicinity thereof in advance in the heating room (see, e.g., Japanese Patent Application Publication No. H11-354503). Accordingly, AFS is prevented from being adhered to the pick or the like and, further, generation of particles can be suppressed.

However, in the method disclosed in Japanese Patent Application Publication No. H11-354503, a cost of the substrate processing system is increased because the heating room needs to be provided. In addition, even if the pick or the like is heated in the heating room, the pick or the like is cooled during movement to the process module. Therefore, in order to maintain the temperature of the pick or the like at a preset level or above, it is required to heat the pick or the like in advance in the heating room whenever the pick or the like moves into the COR processing module or the PHT processing module. As a result, the throughput is not improved. It may be considered to maintain the temperature of the pick or the like at the preset level or above for a certain period of time by excessively heating the pick or the like. In that case, however, excessive heat may be applied to components of the driving mechanism of the transfer arm and this may inflict thermal damage on the driving mechanism.

SUMMARY OF THE INVENTION

In view of the above, the disclosure provides a method for cleaning a substrate transfer mechanism while suppressing an increase in a cost and preventing thermal damage, and a substrate processing system.

In accordance with a first aspec of the present discloserue, there is provided a method for cleaning a substrate transfer mechanism for loading a substrate into a heat treatment chamber for sublimating by-products by heat, the substrate transfer mechanism including a holding unit for holding the substrate, the method including: repeatedly moving the holding unit into and out of the heat treatment chamber.

In accordance with a second aspect of the present discloserue, there is provided a substrate processing system including: a heat treatment chamber configured to sublimate by-products by heat; and a substrate transfer mechanism configured to load a substrate into the heat treatment chamber, wherein the substrate transfer mechanism includes a holding unit for holding the substrate, and wherein the holding unit repeatedly moves into and out of the heat treatment chamber.

In the present disclosure, the holding portion for holding the substrate of the substrate transfer mechanism repetitively moves into and out of the heat treatment chamber for sublimating by-products by heat. At this time, the holding portion can be heated by the heat treatment chamber and, thus, it is not necessary to provide the heating room for heating the holding portion in addition to the heat treatment chamber. Accordingly, the increase in the cost of the substrate processing system can be suppressed. Since the holding portion repetitively moves into and out of the heat treatment chamber, the heating and the cooling of the holding portion is repeated, which makes it possible to maintain the temperature of the holding portion at a constant level or above without excessive heating of the holding portion. As a result, the application of excessive heat to the driving system components of the driving mechanism of the substrate transfer mechanism is prevented and, thus, the thermal damage on the driving mechanism can be prevented.

BRIEF DESCRIPTION OF THE DRAWINGS

The objects and features of the disclosure will become apparent from the following description of embodiments, given in conjunction with the accompanying drawings, in which:

FIGS. 3A and 3B schematically explain a configuration of a transfer arm shown in FIG. 1, wherein FIG. 3A is a top view and FIG. 3B is a side view;

DETAILED DESCRIPTION OF THE EMBODIMENTS

Hereinafter, embodiments will be described in detail with reference to the accompanying drawings.

First, a first embodiment will be described.

Figure 1:
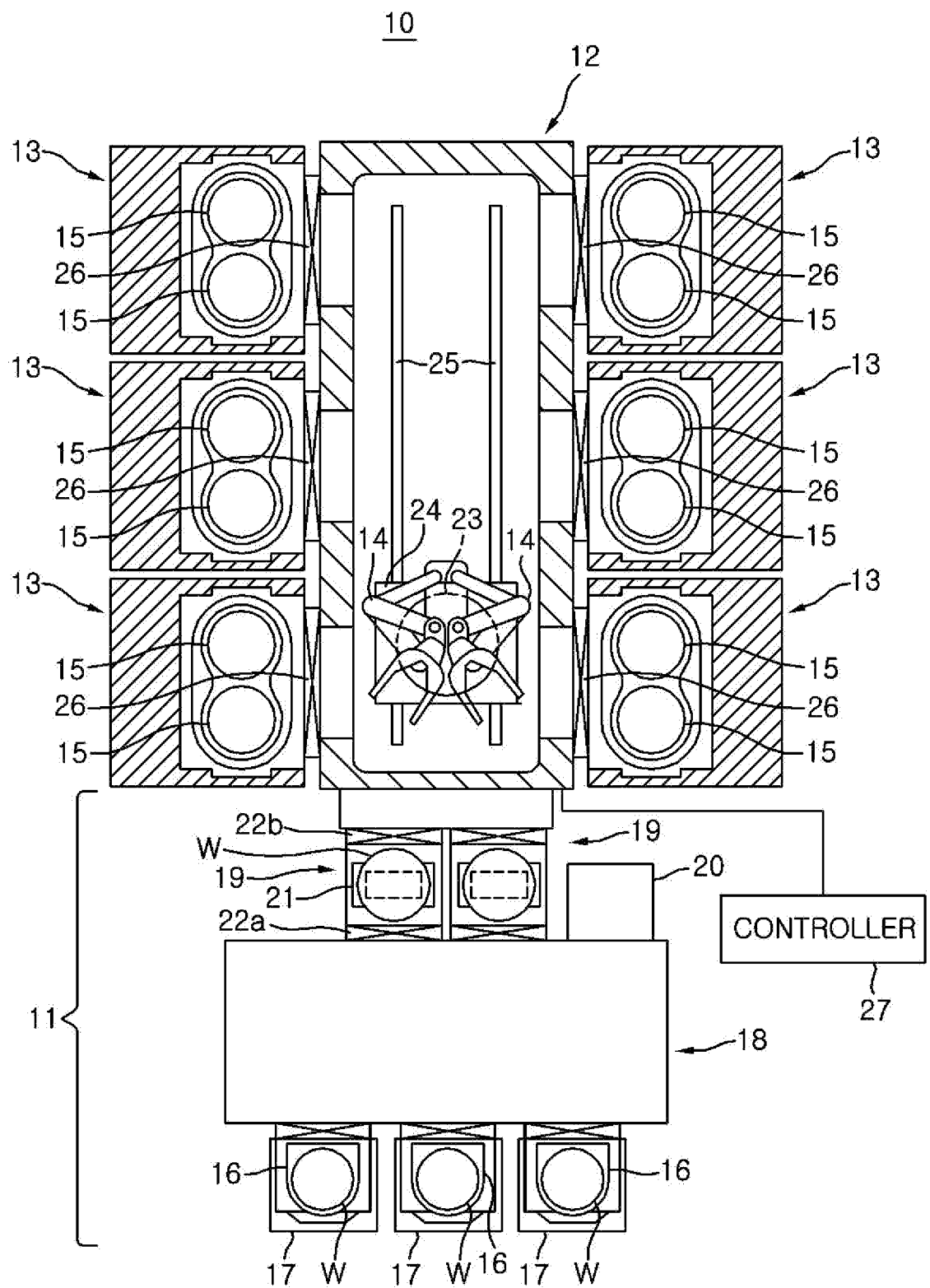
FIG. 1 is a top view schematically showing a configuration of a substrate processing system according to a first embodiment.

FIG. 1 is a top view schematically showing a configuration of a substrate processing system according to the first embodiment. In FIG. 1, a part of an internal structure is illustrated for better understanding.

Referring to FIG. 1, the substrate processing system 10 includes a wafer storage unit 11 for storing a plurality of wafers W, a transfer module 12 serving as a transfer chamber for transferring two wafers W at the same time, a plurality of process modules 13 for performing COR processing or PHT processing on the wafer W loaded from the transfer module 12. Each of the process modules 13 and the transfer module 12 are maintained under a vacuum atmosphere.

In the substrate processing system 10, two wafers W selected among the wafers W stored in the wafer storage unit are held by a transfer arm 14 (substrate transfer mechanism) in the transfer module 12 and transferred in the transfer module 12 by moving the transfer arm 14. The two wafers W are respectively mounted on two stages 15 provided in the process module 13. Then, in the substrate processing system 10, COR processing or PHT processing is performed on the wafers W mounted on the stages 15 in the process module 13. Next, the processed two wafers W are held by the transfer arm 14 and unloaded to the wafer storage unit 11 by moving the transfer arm 14.

The wafer storage unit 11 includes: a plurality of (three or four) load ports 17, each serving as a mounting place for a FOUP 16 that is a vessel where a plurality of wafers W is stored; a loader module 18 for receiving a stored wafer W from the FOUP 16 mounted on the load port 17 or delivering a wafer W that has been subjected to predetermined processing in the process module 13 to the FOUP 16; two load-lock modules 19 for temporarily holding wafers W to be transferred between the loader module 18 and the transfer module 12; and a cooling storage 20 for cooling a wafer W that has been subjected to PHT processing.

The loader module 18 is a rectangular housing in an atmospheric atmosphere, and the load ports 17 are provided at one side surface forming a long side of the rectangle. A transfer arm (not shown) capable of moving in a lengthwise direction of the rectangular loader module 18 is provided in the loader module 18. The transfer arm transfers the wafer W from the FOUP 16 mounted on the load port 17 into the load-lock module 19 or from the load-lock module 19 into the FOUP 16. The FOUP 16 accommodates therein a plurality of wafers W at multiple stages. The insdie of the FOUP 16 mounted on the load port 17 is generally in an atmospheric atmosphere. However, the inside of the FOUP 16 may be filled with nitrogen gas or the like and sealed.

The load-lock modules 19 temporarily holds the wafers W in order to transfer the wafers W accommodated in the FOUP 16 mounted on the load port 17 in an atmospheric atmosphere to the process modules 13 in a vacuum atmosphere. Each of the load-lock modules 19 has a buffer plate 21 for holding two wafers W. Further, each of the load-lock modules 19 includes a gate valve 22a for ensuring airtightness with respect to the loader module 18 and a gate valve 22b for ensuring airtightness with respect to the transfer module 12. A gas introducing system and a gas exhaust system (both not shown) are connected to the load-lock module 19 through lines, and the inside of the load-lock module is controlled to an atmospheric atmosphere or a vacuum atmosphere by the gas introducing system and the gas exhaust system.

The transfer module 12 loads an unprocessed wafer W into the process module 13 from the wafer storage unit 11 and unloads a processed wafer W from the process module 13 into the wafer storage unit 11. The transfer module 12 is configured as a rectangular housing in a vacuum atmosphere. The transfer module 12 includes two transfer arms 14 for holding and moving two wafers W, a rotator 23 for rotatably supporting each of the transfer arms 14, a rotator base 24 on which the rotator 23 is mounted, and a guide rail 25 for guiding the rotator base 24 in a lengthwise direction of the transfer module 12. The transfer module 12 is connected to the load-lock modules 19 of the wafer storage unit 11 and the process modules 13 via the gate valves 22a and 22b and a gate valve 26 to be described later. In the transfer module 12, two wafers W held on the buffer plate 21 in the load-lock module 19 are received and held by the transfer arms 14 and transferred to each process module 13. The two wafers W processed in the process module 13 are held by the transfer arms 14 and transferred to another process module 13 or the load-lock module 19. The rotator base 24 and the guide rail 25 constitute a slide mechanism for moving the rotator 23 in the lengthwise direction in the transfer module 12.

The process modules 13 are connected to the transfer module 12 via the gate valves 26, so that airtightness and communication between the process modules 13 and the transfer module 12 are ensured by the gate valves 26. Each of the process modules 13 has therein two stages 15 for mounting thereon two wafers W side by side in a horizontal direction. Since the two wafers W are mounted side by side on the two stages 15, each of the process modules 13 processes top surfaces of the two wafers W uniformly and simultaneously. In the present embodiment, each of the process modules 13 performs any one of the COR processing and the PHT processing.

Figure 2:
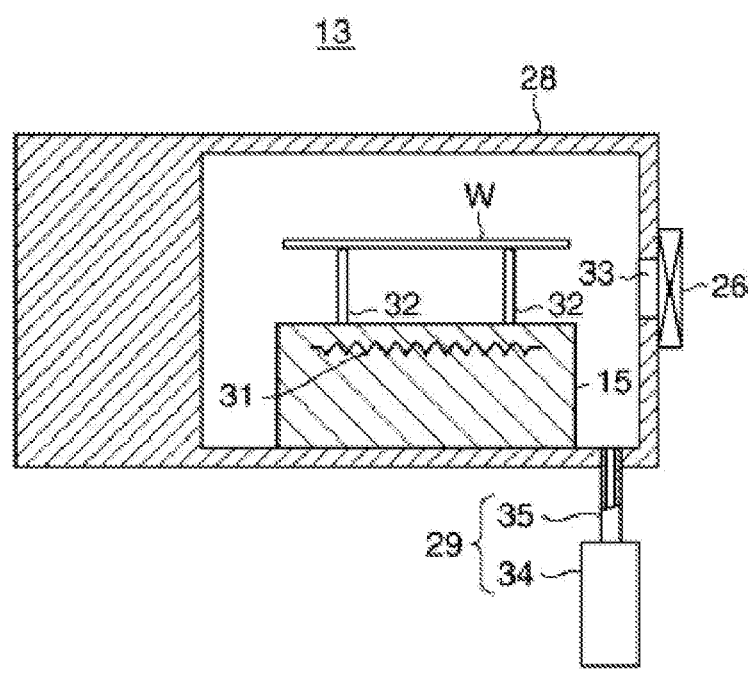
FIG. 2 is a cross sectional view schematically showing a configuration of a process module for performing PHT processing in FIG. 1.

FIG. 2 is a cross sectional view schematically showing a configuration of a process module for performing PHT processing in FIG. 1.

Referring to FIG. 2, a process module (heat treatment chamber) 13 for performing the PHT processing (hereinafter, referred to as "PHT processing module") includes a chamber 28 where a wafer W is accommodated and a gas exhaust unit 29. A cylindrical stage (mounting table) 15 for mounting thereon the wafer W is provided in the chamber 28. A heater 31 for heating the wafer W is provided in the stage 15 and heats the wafer W by heat transferred from the stage 15 to the mounted wafer W. The stage 15 is provided with a plurality of lift pins (separation mechanism) 32 capable of projecting from a top surface of the stage 15. The lift pins 32 lift the wafer W mounted on the stage 15 to be separated from the stage 15.

The chamber 28 has a port 33 that is a through-hole formed at a sidewall thereof. The wafer W held by the transfer arm 14 is loaded into and unloaded from the chamber 28 through the port 33 by the transfer arm 14. The port 33 is opened/closed by an openable/closeable gate valve 26. The gas exhaust unit 29 includes a gas exhaust pump 34 and a line 35. The inside of the chamber 28 is exhausted by the gas exhaust unit 29. In the present embodiment, the PHT processing module 13 performs the PHT processing on the wafer W. The PHT process is a process for sublimating AFS generated in the wafer W by heat.

Referring back to FIG. 1, the substrate processing system 10 further includes a controller 27 as a control unit. The controller 27 controls operations of the respective components of the substrate processing system 10 by executing program or the like stored in a memory or the like which is provided in the controller 27.

Figure 3A:
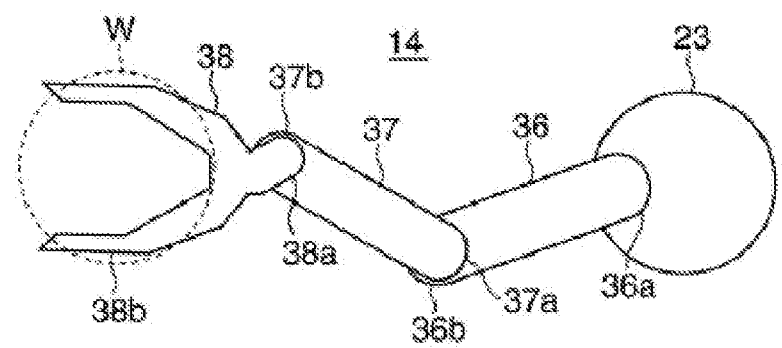
Figure 3B:
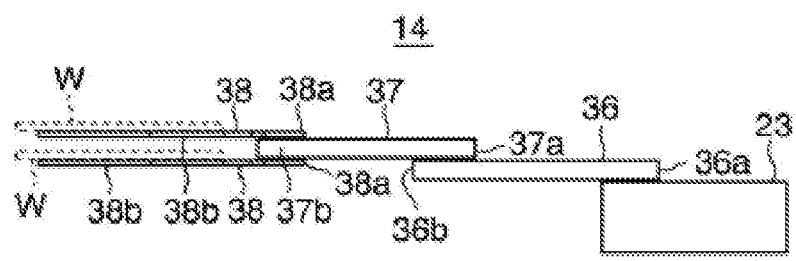

FIGS. 3A and 3B schematically explain a configuration of the transfer arm shown in FIG. 1. FIG. 3A is a top view and FIG. 3B is a side view. As shown in FIG. 1, two transfer arms 14 are provided at the rotator 23. However, in FIGS. 3A and 3B, only one transfer arm 14 is illustrated for simple description.

Referring to FIGS. 3A and 3B, the transfer arm 14 includes a rod-shaped first arm 36, a rod-shaped second arm 37, and two picks 38 (holding portion, holding part), each being configured as a bifurcated flat member. The two picks 38 are superposed in a vertical direction. The first arm 36 has a semicircular one end 36a installed at the rotator 23 and rotates about a central axis (not shown) of one end 36a and in a horizontal direction. The second arm 37 has a semicircular one end 37a installed at the other end 36b of the first arm 36 and rotates about a central axis (not shown) of one end 37a and in a horizontal direction. A base 38a of the pick 38 is bent and installed at the semicircular other end 37b of the second arm 37. The pick 38 rotates about a central axis (not shown) of the other end 37b of the second arm 37 and in a horizontal direction. The first arm 36, the second arm 37 and the pick 38 are rotated by driving mechanisms of the rotator 23, the first arm 36, and the second arm 37. The pick 38 is made of a bulk material having no driving mechanism. For example, the pick 38 is made of a heat-resistant material such as ceramic or the like. The pick 38 holds the wafer W at a bifurcated portion 38b.

As the first arm 36, the second arm 37 and the pick 38 are cooperatively operated at controlled relative rotation angles, the transfer arm 14 is contracted and extended in a right-left direction in the drawing to linearly move and transfer the wafer W held on the pick 38.

Figure 4A:
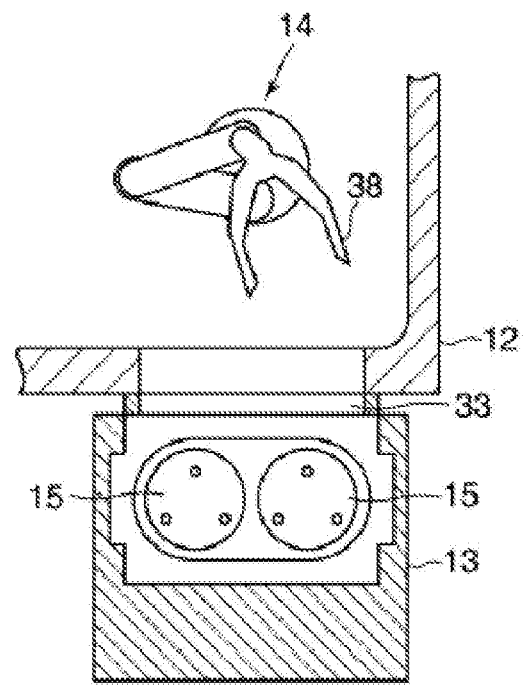
FIGS. 4A and 4B are process diagrams for explaining heat treatment of the transfer arm which is a method for cleaning a substrate transfer mechanism according to the first embodiment.
Figure 4B:
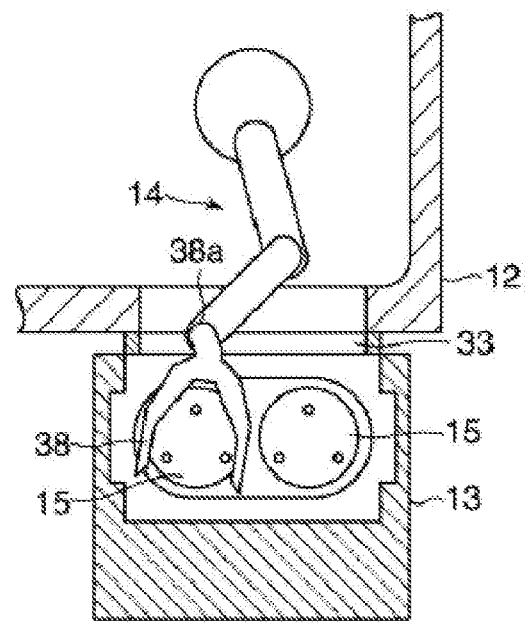
Figure 5A:
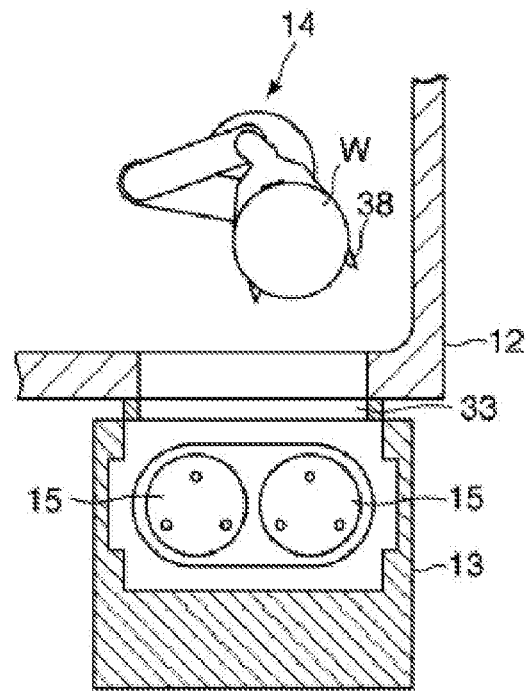
FIGS. 5A to 7B are process diagrams for explaining heat treatment of the transfer arm which is a method for cleaning a substrate transfer mechanism according to a second embodiment.
Figure 5B:
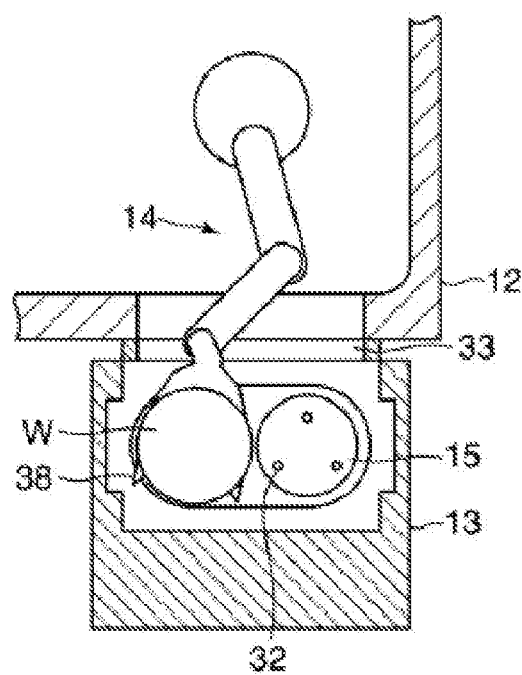

FIGS. 4A and 4B are process diagrams for explaining heat treatment of the transfer arm as a method for cleaning a substrate transfer mechanism according to a first embodiment. The treatment shown in FIGS. 4A and 4B is performed when a predetermined amount of AFS is adhered to the picks 38 of the transfer arm 14 that repeatedly loads and unloads the wafer W into and from the processing module 13 or when the number of execution of the PHT processing or the COR processing reaches a predetermined number. At this time, the picks 38 of the transfer arm 14 hold no wafer W.

First, the transfer module 12 and the PHT processing module 13 are made to communicate with each other through the port 33 by moving the gate valve 26. At this time, the gas exhaust unit 29 of the PHT processing module 13 operates and a pressure in the transfer module 12 is maintained at a level higher than a pressure in the PHT processing module 13 by introducing, e.g., nitrogen gas, into the transfer module 12. The heating of the stage 15 by the heater 31 in the PHT processing module 13 is started. At this time, the transfer arm 14 is contracted and the picks 38 remain in the transfer module 12. Therefore, the picks 38 are not heated by heat radiated from the stage 15 (see FIG. 4A).

Next, the picks 38 move into the PHT processing module 13 by extending the transfer arm 14 and are heated by heat radiated from the stage 15 (see FIG. 4B). At this time, the picks 38 are heated to a predetermined temperature, e.g., 100° C. or above, at which AFS can be sublimated. When the picks 38 are heated, excessive heat from the picks 38 is transferred to the other end 37b of the second arm 37. When the temperature of the other end 37b exceeds, e.g., 80° C., the components of the driving mechanism of the second arm 37 may be damaged. Therefore, in the present embodiment, after the picks 38 are heated to 100° C. or above, the transfer arm 14 is contracted before the temperature of the other end 37b reaches 80° C., so that the picks 38 are retracted for the PHT processing module 13 into the transfer module 12 (see FIG. 4A). At this time, the picks 38 are not heated because heat radiated from the stage 15 is not transferred to the picks 38. The picks 38 are cooled by the introduced nitrogen gas.

Next, the picks 38 are made to move into the PHT processing module 13 by extending the transfer arm 14 before the temperature of the cooled picks 38 is decreased to 100° C., and then are heated by heat radiated from the stage 15 (see FIG. 4B). Thereafter, the processes shown in FIGS. 4A and 4B are repeated.

As described above, in the present embodiment, the pick 38 repeatedly moves into and out of the PHT processing module 13 in a state where the temperature of the picks 38 is not lower than 100° C. and the temperature of the other end 37b of the second arm 37 is not higher than 80° C., and AFS adhered to the picks 38 is sublimated.

In the processing shown in FIG. 4, the picks 38 of the transfer arm 14 repeatedly move into and out of the PHT processing module 13. At this time, since the picks 38 can be heated by the PHT processing module 13, it is not necessary to provide a heating room in addition to the PHT processing module 13 in order to heat the picks 38. Therefore, the increase in the cost of the substrate processing system can be suppressed. Further, since the picks 38 repeatedly move into and out of the PHT processing module 13, the heating and the cooling of the picks 38 are repeated. Therefore, the temperature of the picks 38 can be maintained at a predetermined temperature, e.g., 100° C. or above, without excessively heating the picks 38. As a result, excessive heat is not applied to the components of the driving mechanism of the second arm 37 and, thus, the thermal damage on the driving mechanism can be prevented.

Further, in the processing of FIGS. 4A and 4B, when the picks 38 repeatedly move into and out of the PHT processing module 13, the pressure in the transfer module 12 is maintained at a level higher than a pressure in the PHT processing module 13. Therefore, floating AFS sublimated from the picks 38 can be prevented from moving into the transfer module 12 from the PHT processing module 13. As a consequence, it is possible to prevent AFS from being adhered to the structure in the transfer module 12.

Hereinafter, a second embodiment will be described.

A configuration and an operation of the second embodiment are basically the same as those of the first embodiment. Therefore, the redundant description of the same configuration and operation will be omitted, and different configuration and operation will be described hereinafter.

FIGS. 5A to 7B are process diagrams for explaining the heat treatment of the transfer arm as a method for cleaning a substrate transfer mechanism according to the second embodiment. As in the case of the processes shown in FIGS. 4A and 4B, the processes in FIGS. 5A to 7B are performed when a predetermined amount of AFS is adhered to the picks 38 of the transfer arm 14 that repeats loading/unloading of the wafer W into/from the PHT processing module 13 or when the number of execution of the PHT processing or the COR processing reaches a predetermined number. Unlike the processes shown in FIGS. 4A and 4B, when the processes shown in FIGS. 5A to 7B are started, the upper pick 38 in the transfer arm 14 holds the wafer W.

First, the transfer module 12 and the PHT processing module 13 are made to communicate with each other through the port 33 by moving the gate valve 26. At this time, as in the case of the processes shown in FIGS. 4A and 4B, a pressure in the transfer module 12 is maintained at a level higher than a pressure in the PHT processing module 13. Further, the picks 38 are made to stay in the transfer module 12 by contracting the transfer arm 14 (see FIG. 5A).

Next, the picks 38 move into the PHT processing module 13 by extending the transfer arm 14, and the wafer W held by the upper pick 38 is made to face the stage 15. The heating of the stage 15 by the heater 31 is started. Then, the lift pins 32 project from the top surface of the stage 15 and the wafer W is separated from the upper pick 38 by the lift pins 32 so that the wafer W is held only by the lift pins 32 (see FIG. 5B). Thereafter, the picks 38 are retracted into the transfer module 12 by contracting the transfer arm 14 (see FIG. 6A). At this time, the wafer W held by the lift pins 32 are heated by heat radiated from the stage 15 (see FIG. 7A). In order to effectively heat the wafer W, the wafer W may be mounted on the stage 15 where the lift pins 32 are accommodated and heated by heat transferred from the stage 15. Hereinafter, the wafer W heated by heat radiated or transferred from the stage 15 is referred to as "heated wafer W". When the wafer W is mounted on the stage 15, the heated wafer W is supported by the lift pins 32 and separated from the stage 15 before the picks 38 move into the PHT processing modules 13 as will be described later.

Next, the picks 38 that hold no wafer W move into the PHT processing module 13 by extending the transfer arm 14. At this time, the heated wafer W is separated from the stage 15 by the lift pins 32. Accordingly, the picks 38 move into a space between the stage 15 and the heated wafer W (see FIG. 6B). Then, the lift pins 32 are accommodated in the stage and the heated wafer W is held by the upper pick 38 (holding part of the separated substrate side). At this time, the upper pick 38 is heated by heat transferred to the heated wafer W. The lower pick 38 is heated by heat radiated from the stage 15 (see FIG. 7B) and the picks 38 are heated to a predetermined temperature, e.g., 100° C. or above, at which AFS can be sublimated. Next, before the temperature of the other end 37b of the second arm 37 reaches 80° C., the heated wafer W is held by the lift pins 32 and separated from the upper pick 38. Then, the picks 38 are retracted from the PHT processing module 13 into the transfer module 12 by further contracting the transfer arm 14. At this time, the picks 38 are cooled by nitrogen gas introduced into the transfer module 12 (see FIG. 6A).

Figure 6A:
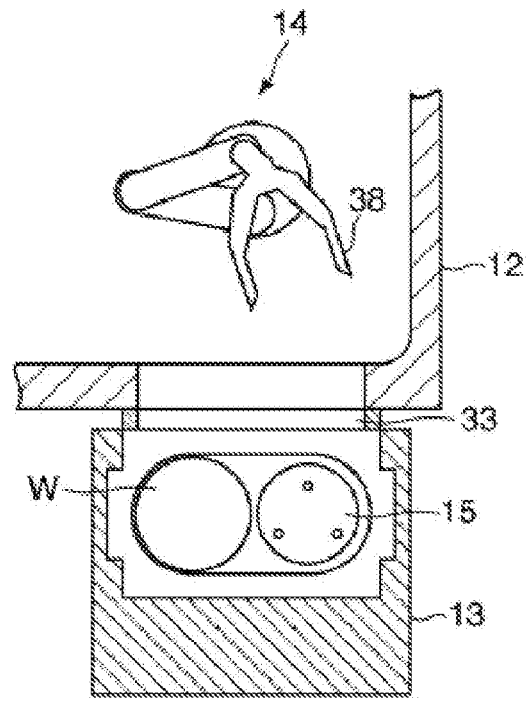
Figure 6B:
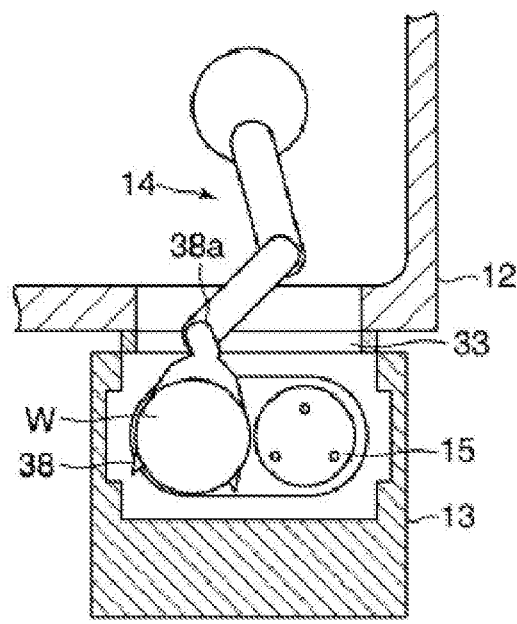
Figure 7A:
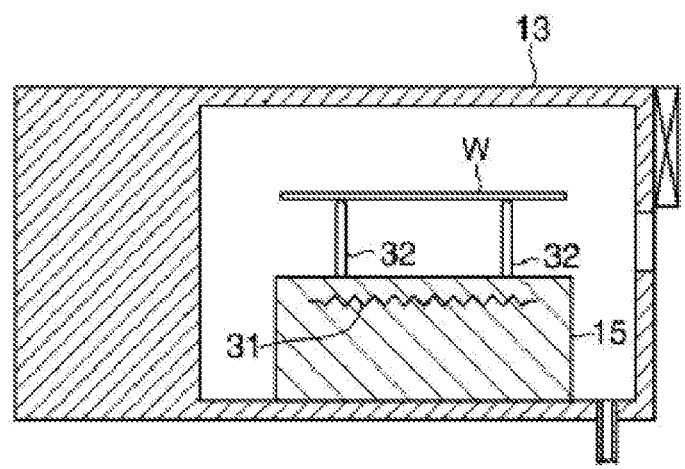
Figure 7B:
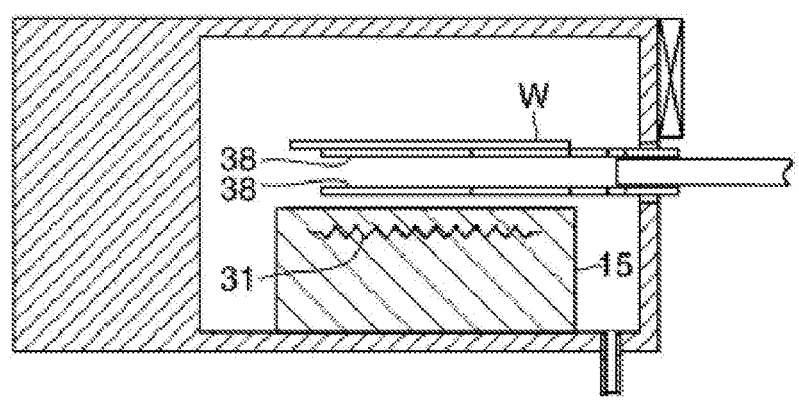

Next, the picks 38 are made to move into the PHT processing module 13 by extending the transfer arm 14 before the temperature of the cooled picks 38 is decreased to 100° C. The heated wafer W is held by the upper pick 38 and the upper pick 38 is heated by heat transferred to the heated wafer W, and the lower pick 38 is heated by heat radiated from the stage 15 (see FIGS. 6B and 7B). Then, the processes illustrated in FIGS. 6A, 6B and 7B are repeated.

As described above, in the present embodiment, the picks 38 repeatedly move into and out of the PHT processing module 13 while maintaining the temperature of the picks 38 at a level higher than 100° C. and the temperature of the other end 37b of the second arm 37 at a level equal to or lower than 80° C. Accordingly, the picks 38 are properly heated by the stage 15 or the heated wafer W, and AFS adhered to the picks 38 is sublimated.

In the processes shown in FIGS. 5A to 7B, when the wafer W heated by the stage 15 is supported by the lift pins 32, the picks 38 move into a space between the stage 15 and the heated wafer W. At this time, the lower pick 38 is heated by heat radiated from the stage 15 and the upper pick 38 is heated by heat radiated from the heated wafer W. In other words, even when the upper pick 38 is shielded from the stage 15 by the lower pick 38, the upper pick 38 can be heated. Therefore, both of the lower pick 38 and the upper pick 38 can be heated. Accordingly, AFS adhered to the picks 38 can be reliably removed. Since the lower pick 38 and the upper pick 38 can be heated quickly, the heating time of the picks 38 can be shortened and a period of time in which heat is transferred to the components of the driving mechanism of the second arm 37 can be shortened, which makes it possible to reliably suppress an increase in temperatures of the corresponding components. As a result, the thermal damage on the driving mechanism can be reliably prevented.

In the processes shown in FIGS. 5A to 7B, the heated wafer W is held by the upper pick 38 and, thus, the upper pick 38 can be reliably heated by heat transferred from the heated wafer W to the upper pick 38.

Further, in the processes shown in FIGS. 5A to 7B, when the picks 38 are retracted from the PHT processing module 13 by the contraction of the transfer arm 14, the heated wafer W supported by the lift pins 32 is heated by heat radiated from the stage 15. However, when the temperature of the heated wafer W is decreased, it is possible to mount the wafer W on the stage 15 where the lift pins 32 are accommodated and heat the mounted wafer W by heat transferred from the stage 15.

In the processes shown in FIGS. 4A and 4B or the processes shown in FIGS. 5A to 7B, the picks 38 are repeatedly heated and cooled while repeatedly moving into and out of the PHT processing module 13. However, it is not necessary that the period of time in which the picks 38 are located inside the PHT processing module 13 is equal to the period of time in which the picks 38 are located outside the PHT processing module 13.

Figure 8:
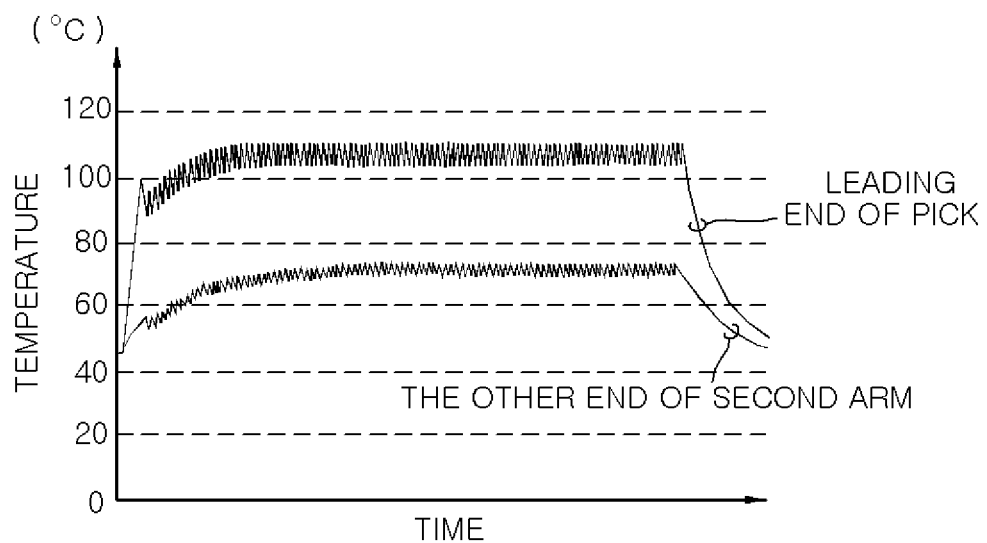
FIG. 8 is a graph for explaining an example of temporal change of temperatures of a leading end of a pick and the other end of a second arm in the heat treatment of the transfer arm which are described in FIGS. 4A to 7B.
Figure 9:
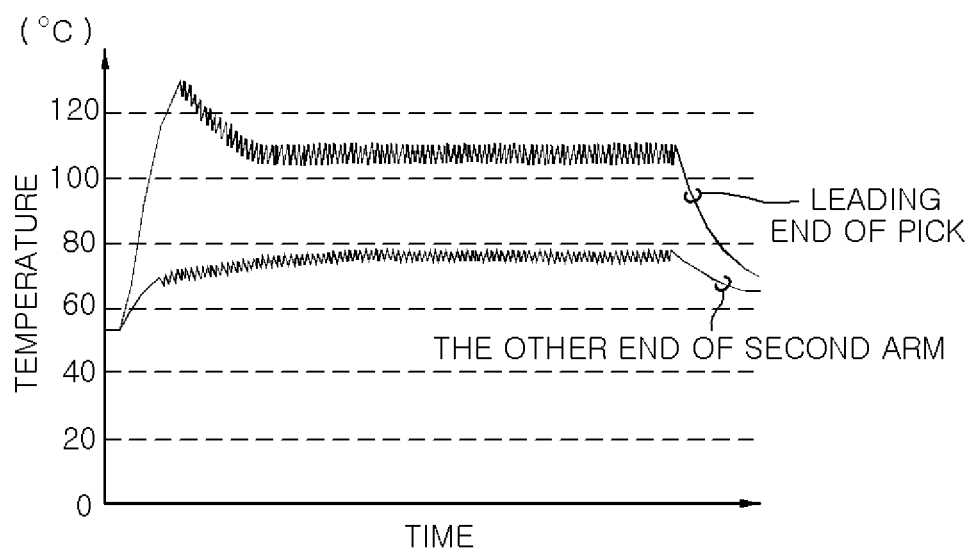
FIG. 9 is a graph for explaining another example of temporal change of temperatures of the leading end of the pick and the other arm of the second arm in the heat treatment of the transfer arm which are described in FIGS. 4A to 7B.

For example, as shown in FIG. 8, first, the heating time of the picks 38 (time in which the picks 38 are located inside the PHT processing module 13) is set to a relatively long period (e.g., five minutes) so that the temperature of the leading ends of the picks 38 can be quickly increased to about 100° C. and, then, the cooling time of the picks 38 (time in which the picks 38 are located outside the PHT processing module 13) is set to a relatively long period (e.g. one minute) so that the temperature of the other end 37b of the second arm 37 does not exceed 80° C. and, then, the heating time and the cooling time of the picks 38 which are relatively short (e.g., 30 seconds) are repeated multiple times so that the temperature of the leading ends of the picks 38 can be gradually increased to 100° C. or above. Or, as shown in FIG. 9, first, the heating time of the picks 38 (time in which the picks 38 are located inside the PHT processing module 13) is set to a relatively long period (e.g., eight minutes) so that the temperature of the leading ends of the picks 38 can be quickly increased to about 130° C. and, then, the heating time and the cooling time of the picks 38 which are relatively short (e.g., 15 seconds) are repeated multiple times so that the temperature of the leading ends of the picks 38 can be gradually decreased to about 100° C.

While the embodiments have been described, the present disclosure is not limited to the above-described embodiments.

For example, although the transfer arm 14 has the two picks 38 that are superposed, the transfer arm 14 may have a single pick 38 or three or more picks 38 that are superposed.

In the processes shown in FIGS. 5A to 7B, after the picks 38 move into the space between the heated wafer W and the stage 15 of the PHT processing module 13, the heated wafer W is held by the upper pick 38. However, the heated wafer W may be continuously supported by the lift pins 32 without being held by the upper pick 38. In that case, the upper pick 38 is heated by heat radiated from the heated wafer W, and it is not necessary to transfer the heated wafer W from the lift pins 32 to the upper pick 38 and from the upper pick 38 to the lift pins 32 during the repetitive movement of the picks 38 into and out of the PHT processing module 13. As a result, a throughput of removal of AFS from the picks 38 can be improved.

In the processes shown in FIGS. 5A to 7B, the heated wafer W is heated by heat radiated or transferred from the stage 15 before the picks 38 repeatedly move into and out of the PHT processing module 13. However, it is also possible to provide a lamp heater in the transfer module 12 and heat the heated wafer W by heat rays irradiated from the lamp heater. The heated wafer W is not limited to a general wafer made of silicon which is used for manufacturing semiconductor devices and may be a dummy wafer made of a material having a better heat holding property than that of the general wafer.

In the processes shown in FIGS. 4A and 4B or the processes shown in FIGS. 5A to 7B, AFS is removed from the picks 38. However, reaction by-products to be removed are not limited to AFS. For example, the present disclosure may be applied to removal of reaction by-products that are sublimated by heat.

The object of the disclosure can also be realized by supplying a storage medium in which a program code of software that realizes the functions of the above-described embodiments is stored to the controller 27 of the substrate processing system 10, and causing a CPU of the controller 27 to read out and execute the program code stored in the storage medium.

In this case, the program code itself read out from the storage medium realizes the functions of the above-described embodiments and, thus, the program code and the storage medium in which the program code is stored constitute the present invention.

The storage medium for supplying the program code may be, e.g., a RAM, a NVRAM, a floppy (registered trademark) disk, a hard disk, a magneto-optical disk, an optical disk such as CD-ROM, CD-R, CD-RW, DVD (DVD-ROM, DVD-RAM, DVD-RW, DVD+RW), a magnetic tape, a non-volatile memory card, another ROM or the like which may store the program code. Alternatively, the program code may be downloaded from another computer (not shown), database or the like connected to the Internet, a commercial network or a local area network and then supplied to the controller 27.

The functions of the above-described embodiments may be realized not only by executing the program code read out by the controller 27 but also by causing an OS (operating system) or the like which operates in the CPU to perform a part or all of actual operations based on instructions of the program code.

The functions of the above-described embodiments may also be realized by storing the program code read out from the storage medium in a memory provided for a functional extension board inserted into the controller 27 or a function extension unit connected to the controller 27 and then causing the CPU provided for the functional extension board or the function extension unit to perform a part or all of the actual operations based on the instructions of the program code.

The program code may be an object code, a program code executed by an interpreter, script data supplied to the OS, or the like.

While the disclosure has been shown and described with respect to the embodiments, it will be understood by those skilled in the art that various changes and modifications may be made without departing from the scope of the disclosure as defined in the following claims.

What is claimed is:

1. A substrate processing system comprising:
   a heat treatment chamber configured to sublimate by-products by heat; and
   a substrate carrier configured to load a substrate into the heat treatment chamber, the substrate carrier including a holder for holding the substrate, and
   a controller configured to control operations of the heat treatment chamber, the substrate carrier, and the holder,
   wherein the controller is programmed to control the sublimation to, (a) maintain a temperature of the holding unit at a level equal to or higher than a predetermined temperature, while (b) inhibiting thermal damage to the substrate transfer mechanism excluding the holding unit, wherein the controller control includes: repeatedly moving the holding unit into and out of the heat treatment chamber, wherein when the holding unit repeatedly moves into and out of the heat treatment chamber, the temperature of the holding unit is maintained at the level equal to or higher than the predetermined temperature by, once the holding unit moves out of the heat treatment chamber and is cooled, moving the holding unit again into the treatment chamber before the temperature of the holding unit is decreased to the predetermined temperature.

2. The substrate processing system of claim 1, wherein the heat treatment chamber includes:

a mounting table configured to mount and heat the substrate; and
a separator configured to separate the substrate from the mounting table, and wherein
the holder has at least two holding parts that are superposed, and
wherein the controller is further programed to, when the substrate heated by the mounting table is separated from the mounting table while being supported by the separator, move the holder into a space between the mounting table and the separated substrate.

3. The substrate processing system of claim 2,
wherein the controller is further programed to, after the holder moves into the space between the mounting table and the separated substrate, let the holding part disposed closest to the separated substrate hold the separated substrate.

4. The substrate processing system of claim 2,
wherein the controller is further programed to, even after the holder moves into the space between the mounting table and the separated substrate, let the separator continuously support the separated substrate.

5. The substrate processing system of claim 1,
wherein the substrate processing system further includes a transfer chamber in which the substrate carrier is provided, and
the controller is further programed to, when the holder repeatedly moves into and out of the heat treatment chamber, set a pressure in the transfer chamber to be higher than a pressure in the heat treatment chamber.

6. The substrate processing system of claim 2,
wherein the substrate processing system further includes a transfer chamber in which the substrate carrier is provided, and
the controller is further programed to, when the holder repeatedly moves into and out of the heat treatment chamber, set a pressure in the transfer chamber to be higher than a pressure in the heat treatment chamber.

7. The substrate processing system of claim 3,
wherein the substrate processing system further includes a transfer chamber in which the substrate carrier is provided, and
the controller is further programed to, when the holder repeatedly moves into and out of the heat treatment chamber, set a pressure in the transfer chamber to be higher than a pressure in the heat treatment chamber.

8. The substrate processing system of claim 4,
wherein the substrate processing system further includes a transfer chamber in which the substrate carrier is provided, and
the controller is further programed to, when the holder repeatedly moves into and out of the heat treatment chamber, set a pressure in the transfer chamber to be higher than a pressure in the heat treatment chamber.

9. A substrate processing system comprising:
a heat treatment chamber configured to sublimate by-products by heat, the heat treatment chamber including:
a mounting table configured to mount and heat the substrate; and
a separator configured to separate the substrate from the mounting table;
a substrate carrier configured to load a substrate into the heat treatment chamber, the substrate carrier including a holder for holding the substrate, and the holder having at least two holding parts that are superposed; and
a controller configured to control operations of the heat treatment chamber, the mounting table, the separator, the substrate carrier, and the holder,
wherein the controller is programmed to control the sublimation to, (a) maintain a temperature of the holding unit at a level equal to or higher than a predetermined temperature, while (b) inhibiting thermal damage to the substrate transfer mechanism excluding the holding unit, wherein the controller control includes: repeatedly moving the holding unit into and out of the heat treatment chamber, wherein when the holding unit repeatedly moves into and out of the heat treatment chamber, the temperature of the holding unit is maintained at the level equal to or higher than the predetermined temperature by, once the holding unit moves out of the heat treatment chamber and is cooled, moving the holding unit again into the treatment chamber before the temperature of the holding unit is decreased to the predetermined temperature, and
wherein the controller is further programed to, when the substrate heated by the mounting table is separated from the mounting table while being supported by the separator, move the holder into a space between the mounting table and the separated substrate.

10. The substrate processing system of claim 9,
wherein the controller is further programed to, after the holder moves into the space between the mounting table and the separated substrate, let the holding part disposed closest to the separated substrate hold the separated substrate.

11. The substrate processing system of claim 10,
wherein the substrate processing system further includes a transfer chamber in which the substrate carrier is provided, and
the controller is further programed to, when the holder repeatedly moves into and out of the heat treatment chamber, set a pressure in the transfer chamber to be higher than a pressure in the heat treatment chamber.

12. The substrate processing system of claim 9,
wherein the controller is further programed to, even after the holder moves into the space between the mounting table and the separated substrate, let the separator continuously support the separated substrate.

13. The substrate processing system of claim 12,
wherein the substrate processing system further includes a transfer chamber in which the substrate carrier is provided, and
the controller is further programed to, when the holder repeatedly moves into and out of the heat treatment chamber, set a pressure in the transfer chamber to be higher than a pressure in the heat treatment chamber.

14. The substrate processing system of claim 9,
wherein the substrate processing system further includes a transfer chamber in which the substrate carrier is provided, and
the controller is further programed to, when the holder repeatedly moves into and out of the heat treatment chamber, set a pressure in the transfer chamber to be higher than a pressure in the heat treatment chamber.

* * * * *